United States Patent [19]

Kawano

[11] Patent Number: 5,596,591
[45] Date of Patent: Jan. 21, 1997

[54] GAIN-GUIDED TYPE LASER DIODE

[75] Inventor: Hideo Kawano, Tokyo, Japan

[73] Assignee: NEC Corporation, Tokyo, Japan

[21] Appl. No.: 205,170

[22] Filed: Mar. 3, 1994

[30] Foreign Application Priority Data

Mar. 3, 1993 [JP] Japan ................... 5-041618

[51] Int. Cl.$^6$ ................... H01S 3/18
[52] U.S. Cl. ................... 372/46
[58] Field of Search ................... 372/46, 45

[56] References Cited

U.S. PATENT DOCUMENTS

| | | | |
|---|---|---|---|
| 4,982,409 | 1/1991 | Kinoshita et al. | 372/45 |
| 5,036,521 | 7/1991 | Hatakoshi et al. | 372/46 |
| 5,157,679 | 10/1992 | Kondow et al. | 372/46 |
| 5,268,328 | 12/1993 | Mori et al. | 372/45 |

FOREIGN PATENT DOCUMENTS

| | | |
|---|---|---|
| 0328134 | 8/1989 | European Pat. Off. . |
| 0373933 | 6/1990 | European Pat. Off. . |
| 2181486 | 7/1990 | Japan . |

OTHER PUBLICATIONS

A. Gomyo et al., "Aging Characteristics of Al GaInP/GaInP Visible–Light Lasers ($\lambda_L$ = 678 nm)," *Electronics Letters*, vol. 23, No. 2, Jan. 16, 1987, p. 85.

M. Ishikawa et al., "Long–Term Reliability Tests for InGaAlP Visible Laser Diodes," *Japanese Journal of Applied Physics*, vol. 28, No. 9, Sep. 1989, pp. 1615–1621.

M. Okajima et al., "Transverse–Mode Stabilized GaAl As Laser With An Embedded Confining Layer on Optical Guide by MOCVD," *IEDM Technical Digest*, Dec. 5–7, 1983, cover page and pp. 292–295.

*Primary Examiner*—Rodney B. Bovernick
*Assistant Examiner*—Robert McNutt
*Attorney, Agent, or Firm*—Burns, Doane, Swecker & Mathis, LLP

[57] ABSTRACT

A gain-guided type AlGaInP visible light laser diode in accordance with the present invention has a characteristic in that, an n-type current-blocking layer for the current constriction in the double-heterojunction structure in highly doped with n-type impurity so as to prevent the formation of p-type inversion layer therein. When an n-GaAs current-blocking layer is formed on a p-GaInP etching stopper layer doped with zinc, the n-type impurity concentration of the n-GaAs current blocking layer is selected to be $3\times10^{18}$ cm$^{-3}$ or more to achieve a large kink-light output at a low oscillation threshold current.

1 Claim, 2 Drawing Sheets

GAIN-GUIDED TYPE LASER DIODE

BACKGROUND OF THE INVENTION

The present invention relates to gain-guided type laser diodes, and more particularly to AlGaInP visible light laser diodes with oscillation wavelength not greater than 680 nm.

The gain-guided type laser diodes are attractive light sources for barcode readers in POS and FA systems. A conventional gain-guided type AlGaInP visible light laser diode is shown in FIG. 1 as reported in ELECTRONICS LETTERS 16th Jan. 1987 Vol. 23, No. 2, p.85.

Referring to FIG. 1, an n-GaAs buffer layer 2 is formed on an n-GaAs substrate 1. On top of the buffer layer 2 there is formed a double heterojunction structure consisting of an n-AlGaInP cladding layer 3, a GaInP active layer 4, a p-AlGaInP cladding layer 5, a p-GaInP etching stopper layer 6, a pair of n-GaAs current blocking layers 7 and a p-GaAs contact layer 8.

Here, the fabrication step of the conventional structure shown in FIG. 1 will be described. First, a six-layer structure from the n-GaAs buffer layer 2 to the n-GaAs current blocking layer 7 is grown sequentially by using a first vapor phase growth technique such as MOVPE (Metal-Organic Vapour Phase Epitaxy). Subsequently, a trench stripe 9 is formed in n-GaAs current blocking layer 7 to expose a stripe region of p-GaInP etching stopping layer 6. Over the entire surface of n-GaAs current blocking layer 7 including stripe 9 is formed by the second MOVPE growth a p-GaAs contact layer 8 over the entire surface of which in turn a p-side ohmic electrode 10 of Ti/Pt/An is deposited. Further an n-side ohmic electrode 11 of AuGeNi is deposited on the entire undersurface of substrate 1.

In this prior structure, the current is constructed by the p-GaAs contact layer 8 and the GaAs current blocking layer 7. The p-GaInP etching stopper layer 6 serves, for forming a stripe 9 in n-GaAs of current blocking layer 7 by chemical etching, to stop the etching to prevent from being over-etched, and has another purpose of reducing electrical resistance between the p-AlGaInP cladding layer 5 and the p-GaAs contact layer 8. In such a gain-guided type laser diode, injected carriers causes a refractive index difference in the active layer to guide a light along with the stripe direction.

Although the above stated gain-guided type laser diodes can be made easily compared with a buired hetero structure type laser diodes, so called kink is appeared in its current-light output characteristic when the output is increased. This is because the active layer of the gain-guide type laser diodes has no waveguide mechanism of refractive index difference in a direction parallel to pn junction plane. When the output is increased, a transversal mode of the output light becomes unstable and causes the kink.

The conventional gain-guided type laser diodes shown in FIG. 1 causes the kink in a low output light level. When the gain-guided type laser diode is used for a light source of a barcode reader, the position of the kink level is significant. The light output level must be kept below the kink level, otherwise the barcode reader will cause a miss reading. To this end, it is desired to increase the kink level as high as possible.

It is known that the kink level can be increased by narrowing the stripe width of the laser diode. But when the stripe width is decreased, a threshold current is drastically increased. In view of the threshold current, the stripe width should be selected about 7 µm. Despite of such suitable stripe width, the kink level of the conventional gain-guided type laser diode is still low such as about 3 mW as shown in FIG. 3.

SUMMARY OF THE INVENTION

Therefore, an object of the present invention is to provide a gain-guided type laser diode capable of accomplishing laser oscillation of a large kink light output with a suitable stripe width for achieving a low threshold current.

A feature of the gain-guided type laser diodes in accordance with the present invention is that the current blocking layer is highly doped with n-type impurity so as to prevent the formation of p-type inversion layer therein closer to the p-type etching stopper layer.

In case of an n-GaAs current blocking layer is formed on a p-GaInP etching stopper layer doped with zinc, the n-type impurity concentration of the n-GaAs current blocking layer is selected to be $3\times10^{18}$ cm$^{-3}$ or more to increase kink-light output level at a low oscillation threshold current.

DETAILED DESCRIPTION OF PREFERRED EMBODIMENT

Prior to showing the embodiment of the present invention, detailed analysis of the prior art structure will be described by referring analytical FIG. 2. So far, there is no specific report about the reason why the conventional gain-guided type laser diode has such low kink level despite of narrow stripe width. The present inventor examined the prior art structure and found the fact that a pn junction is formed within the current blocking layer closer to the etching stopper layer. That pn junction is formed by a p-type inversion layer caused by the Zn diffusion from the p-GaInP etching stopper layer. In view of crystal quality, doped impurity concentration in both of the n-GaAs current blocking layer and p-GaInP etching stopper layer has been selected to be the same level such as $1\times10^{18}$ cm$^{-3}$.

During the second MOVPE growth of p-GaAs contact layer 8, thermal treatment cycle causes thermal diffusion of Zn impurity doped in p-GaInP etching stopper layer 6 into n-GaAs current blocking layer 7. In general thought, taking the boundary conditions into consideration, solid-solid diffusion concentration of Zn from etching stopper layer 6 into current blocking layer 7 can be reduced by about one order of magnitude to up to $10^{17}$ cm$^{-3}$ in Zn concentration, which is estimated to be one order of magnitude smaller than the doped-Si concentration in current blocking layer 7 ($1\times10^{18}$ cm$^{-3}$), thus remaining out of question. It however, has been demonstrated experimentally that after practical growth of p-GaAs contact layer 8, the pn junction (shown with dash line in FIG. 2) was formed by Zn diffusion in n-GaAs current blocking layer 7. Under growth conditions of temperature 650° C., 30 minutes was observed Zn diffusion down to 0.1 µm deep in n-GaAs current blocking layer 7.

This is guessed that an excessive amount of electrically-inert Zn impurity from the doped Zn impurity (concentration: $1\times10^{18}$ cm$^{-3}$) existing in p-GaInP etching stopper layer 6 enhances gn diffusion into the overlying n-GaAs current blocking layer 7 caused by the thermal treatment.

Figure 1:
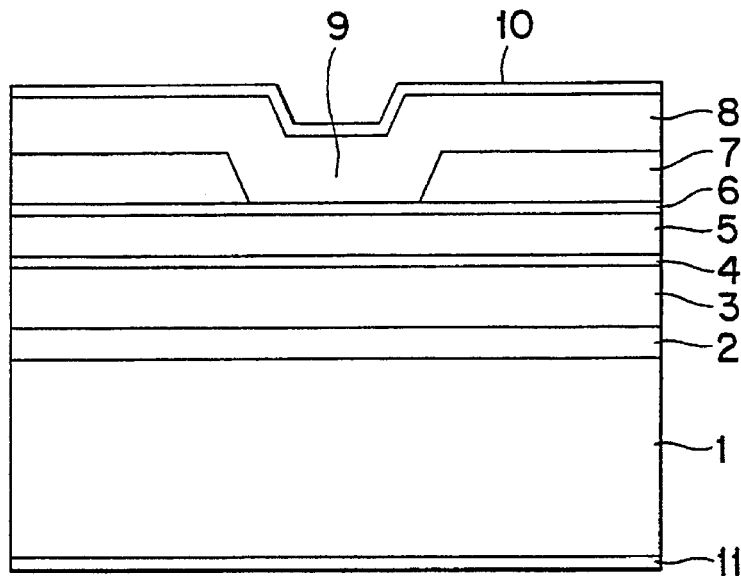
FIG. 1 is a cross-sectional view of a prior art gain-guided type laser diode.
Figure 2:
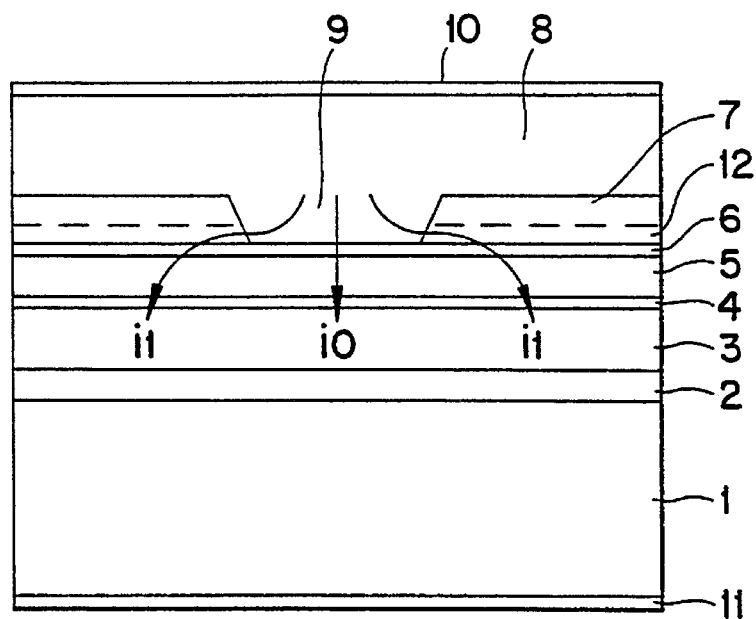
FIG. 2 is an explanatory view of a gain-guided type laser diode for analizing the problem of the prior art structure.

As shown in FIG. 2 therefore a p-GaAs diffused inversion layer 12 is formed in n-GaAs current blocking layer. It serves as a path allowing a part of the injected current necessary for laser oscillation to flow therethrough as a leakage current (indicated by $i_1$ in FIG. 2), with a result that the effective current-injection width is more than the stripe width, which in turn leads to a reduced kink light output as shown in the current-light output characteristic of FIG. 4, and a higher oscillation threshold current. With a stripe width of 7 µm, a kink light output appears at 3 mW.

Figure 3:
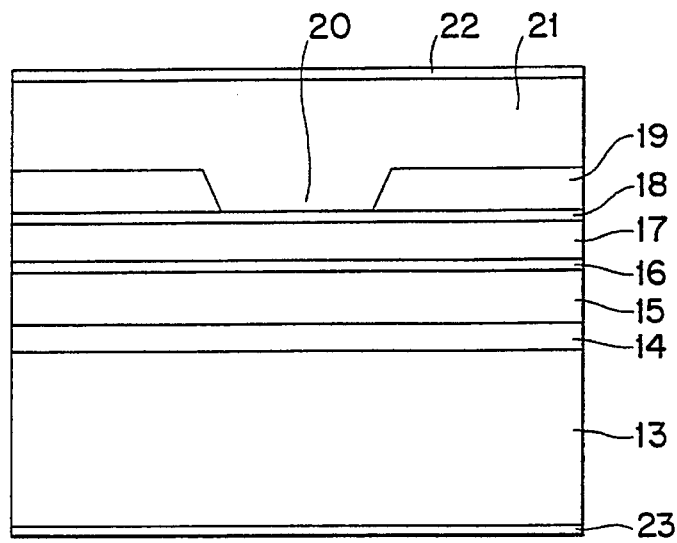
FIG. 3 is an illustrative cross-section of a gain-guided laser diode according to the embodiment of the present invention.

Referring to FIG. 3, an embodiment of the present invention will be described below.

On an n-GaAs substrate 13 with major plane (100) (n-type impurity concentration: $2\times10^{18}$ cm$^{-3}$) a double heterojunction structure is grown in the following: by MOVPE technique at reduced pressures using organic III-group metal compounds (trimethyl indium, triethyl gallium, trimethyl aluminium) and V-group element hydrides (PH$_3$, AsH$_3$) as starting materials, an n-GaAs buffer layer (n-type impurity concentration: $1\times10^{18}$ cm$^{-3}$) 14 of 0.5 µm thick, an n-(Al$_{0.6}$Ga$_{0.4}$)$_{0.5}$In$_{0.5}$P cladding layer (n-type impurity concentration: $5\times10^{17}$ cm$^{-3}$) 15 of 1 µm thick, a Ga$_{0.5}$In$_{0.5}$P active layer 16 of 0.06 µm thick, a p-(Al$_{0.6}$Ga$_{0.4}$)$_{0.5}$In$_{0.5}$P cladding layer (p-type impurity concentration: $3\times10^{17}$ cm$^{-3}$) 17 of 1 µm thick, a p-Ga$_{0.5}$In$_{0.5}$P etching stopper layer (p-type impurity concentration: $2\times2^{18}$ cm$^{-3}$) 18 of 0.1 µm thick, and an n$^+$-GaAs current blocking layer (n-type impurity concentration: $5\times10^{18}$ cm$^{-3}$) 19 of 0.6 µm are shown in sequence one on top of another. Subsequently using SiO$_2$ film or photoresist film as mask, a trench stripe 20 is formed which extends through n$^+$-GaAs current blocking layer 19 to expose p-Ga$_{0.5}$In$_{0.5}$P etching stopper layer 18. This is obtained by selective etching of n$^+$-GaAs current blocking layer 19 and nothing else by using a liquid mixture of H$_3$PO$_4$, H$_2$O$_2$ and H$_2$O.

Subsequently a p-GaAs contact layer 21 (p-type impurity concentration: $3\times10^{18}$ cm$^{-3}$) is grown to a thickness of 4 µm by the second MOVPE using triethyl gallium and AsH$_3$ as starting materials under a reduced pressure as shown in FIG. 3. Thereafter a p-side electrode 22 of Ti/Pt/An is formed on p-GaAs contact layer 21 and a n-side electrode 23 of AuGeNi on the undersurface of substrate 13. Thus a semiconductor laser of the structure shown in FIG. 3 is completed.

Figure 4:
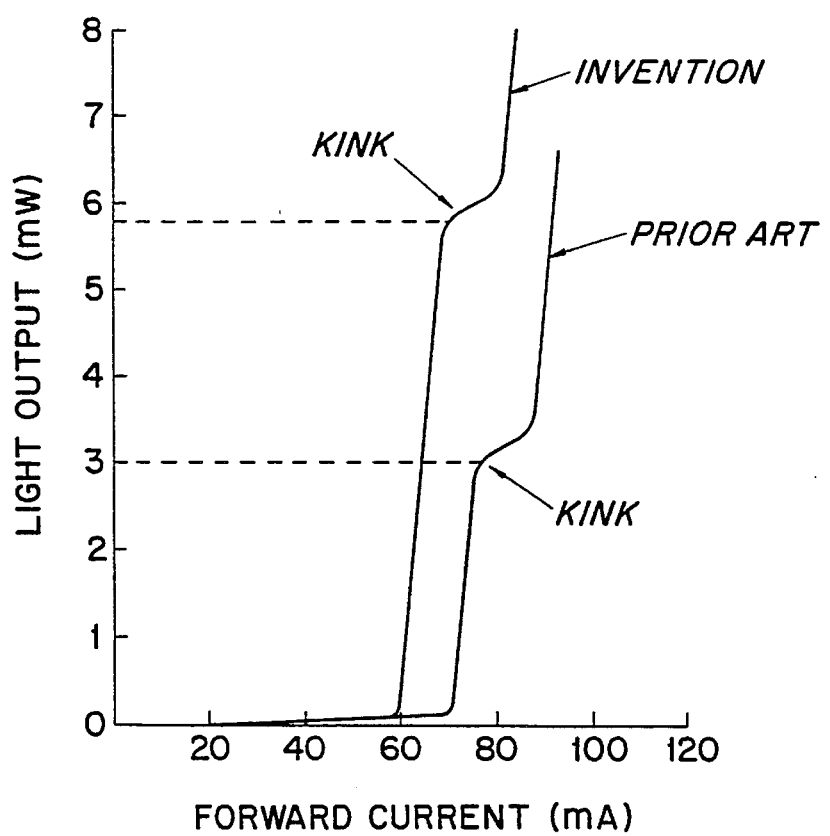
FIG. 4 is a graph of the laser oscillation characteristic (relationship between the forward current and light output) illustrating the effects of the embodiment in comparison with the prior art.

By the way, n$^+$-GaAs current blocking layer 19 is doped with an n-type impurity of Si from SiH$_4$ used as a starting material to a concentration of $5\times10^{18}$ cm$^{-3}$, and thereby the prevention of diffusion of Zn into n$^+$-GaAs current blocking layer 19 is achieved as shown in FIG. 4.

In the foregoing embodiment, although the n-type impurity (Si) concentration is selected to be $5\times10^{18}$ cm$^{-3}$, experiments shows that a suitable concentration is ranged from $4\times10^{18}$ cm$^{-3}$ to $9\times10^{18}$ cm$^{-3}$ as shown in the TABLE 1 to show the high kink level of around 6 mW (5.8 mW to 6.2 mW) with low threshold current level of around 60 mA (58 mA to 60 mA).

TABLE 1

| Sample | n-type impurity concentration | Threshold Current | Kink light output |
|---|---|---|---|
| 1 | $4 \times 10^{18}$ cm$^{-3}$ | 58 mA | 6.0 mW |
| 2 | $5 \times 10^{18}$ cm$^{-3}$ | 60 mA | 5.8 mW |
| 3 | $9 \times 10^{18}$ cm$^{-3}$ | 60 mA | 6.2 mW |

The lower limit of the n-type impurity concentration of the GaAs current blocking layer is related to the excessive amount of Zn impurity in the p-GaInP etching stopper layer. Generally, since the upper limit of the Zn doping concentration in a GaInP layer is $2\times10^{18}$ cm$^{-3}$ due to saturation phenomenon peculiar to the material. The foregoing experiments indicates that the formation of the p-type inversion layer is prevented by selecting the impurity concentration of the n$^+$-GaAs current blocking layer to be $4\times10^{18}$ cm$^{-3}$ or more. If the p-GaInP etching stopper layer has a conventional impurity concentration of $1\times10^{18}$ cm$^{-3}$, it is expected to that the impurity concentration of $3\times10^{18}$ cm$^{-3}$ in the n-GaAs current blocking layer is effective to improve the kink level.

On the other hand, The upper limit of the n-type impurity concentration of GaAs current blocking layer may be $1\times10^{19}$ cm$^{-3}$. If exceeding this upper limit, the crystal quality of n$^+$-GaAs current blocking layer will be deteriorated and results in shortening the life time of the laser diode, In view of the product yield, it is proper to select its impurity concentration to be $9\times10^{18}$ cm$^{-3}$ or less.

As described above, the impurity concentration of the current blocking layer of the present invention should be selected to be $3\times10^{18}$ cm$^{-3}$ or more, and preferably, it is selected between $4\times10^{18}$ cm$^{-3}$ to $1\times10^{19}$ cm$^{-3}$. The most preferable range is $4\times10^{18}$ cm$^{-3}$ to $9\times10^{18}$ cm$^{-3}$. In other words, impurity concentration of the current blocking layer is selected to be about twice or more of that of the etching stopper layer.

A suitable stripe width is not restricted to 7 µm width as in the case of the foregoing embodiment. However, if the stripe width exceeds more than 8 µm, the kink level is drastically increased while the stripe width is selected to be narrower than 6 µm, the threshold current increases drastically. Therefore, it is preferable to select the stripe width in the range of 6 µm to 8 µm in the present invention.

According to the present invention, since the kink level is increased to about 6 mW, a barcode reader employing the present invention as a light source can operate without causing miss-reading when it is used at output power of 5 mW. Furthermore, the barcode reader of high output power such as 5 mW can be used for reading an object located at a long distance point such as about 2 m away. This is quite contrast to a conventional barcode reader of low output power of 3 mW, which can be used only a short distance such as 30 cm or less. Foregoing example is one of the great benefits of the present invention.

As described above, the present invention, because of lack of p-type inversion layer to be formed by the Zn diffusion into the current blocking layer 19, enables to realize laser oscillation with larger kink-light output at low threshold currents as compared with the prior art gain-guided type laser diode.

What is claimed is:

1. A gain-guided type visible light laser diode comprising: a substrate of GaAs having a first conductivity type; a buffer layer of GaAs formed on said substrate and having said first conductivity type; a first cladding layer of AlGaInP formed on said buffer layer and having said first conductivity type; an active layer formed on said first cladding layer, a second cladding layer of AlGaInP formed on said active layer and having a second conductivity type; an etching stopper layer of GaInP formed on said second cladding layer and being doped with zinc to have said second conductivity type and having an impurity concentration selected to be approximately $2\times10^{18}$ cm$^{-3}$; a pair of current blocking layers so as to expose a stripe region of etching stopper layer, each of said current blocking layers being doped with silicon to have said first conductivity type, impurity concentration of said current blocking layers being selected to be at least $5\times10^{18}$ cm$^{-3}$; a contact layer and said stripe region of said etching stopper layer; a first electrode layer formed on said contact layer; and a second electrode layer formed on the bottom surface of said substrate, and thereby attaining a kink level of at least 5.8 mW with a threshold current level of not more than 60 mA.

* * * * *